(12) United States Patent
Zhang et al.

(10) Patent No.: US 12,258,856 B2
(45) Date of Patent: Mar. 25, 2025

(54) SYSTEMS AND METHODS TO DETERMINE TORQUE AND DRAG OF A DOWNHOLE STRING

(71) Applicant: Landmark Graphics Corporation, Houston, TX (US)

(72) Inventors: Yuan Zhang, Missouri City, TX (US); Robello Samuel, Cypress, TX (US)

(73) Assignee: Landmark Graphics Corporation, Houston, TX (US)

( * ) Notice: Subject to any disclaimer, the term of this patent is extended or adjusted under 35 U.S.C. 154(b) by 339 days.

(21) Appl. No.: 17/612,543

(22) PCT Filed: Jan. 22, 2020

(86) PCT No.: PCT/US2020/014624
§ 371 (c)(1),
(2) Date: Nov. 18, 2021

(87) PCT Pub. No.: WO2020/256790
PCT Pub. Date: Dec. 24, 2020

(65) Prior Publication Data
US 2022/0243580 A1    Aug. 4, 2022

Related U.S. Application Data

(60) Provisional application No. 62/865,097, filed on Jun. 21, 2019.

(51) Int. Cl.
*E21B 47/024*    (2006.01)
*E21B 47/007*    (2012.01)
*G06F 30/23*    (2020.01)

(52) U.S. Cl.
CPC ......... *E21B 47/024* (2013.01); *E21B 47/007* (2020.05); *G06F 30/23* (2020.01)

(58) Field of Classification Search
CPC ...... E21B 47/024; E21B 47/007; E21B 44/04; E21B 7/04; E21B 47/02; G06F 30/23
See application file for complete search history.

(56) References Cited

U.S. PATENT DOCUMENTS

| | | | |
|---|---|---|---|
| 4,848,144 A | 7/1989 | Ho | |
| 5,044,198 A * | 9/1991 | Ho | E21B 47/007 73/152.59 |

(Continued)

FOREIGN PATENT DOCUMENTS

| | | |
|---|---|---|
| CA | 2942097 A1 | 3/2018 |
| CN | 101983276 A | 3/2011 |

(Continued)

OTHER PUBLICATIONS

Cooper et al. (Field Data Supports the Use of Stiffness and Tortuosity in Solving Complex Well Design Problems, SPE/IADC 52819, 1999) (Year: 1999).*

(Continued)

*Primary Examiner* — Mohammad K Islam
(74) *Attorney, Agent, or Firm* — DeLizio, Peacock, Lewin & Guerra, LLP

(57) ABSTRACT

The embodiments include systems and methods to determine torque and drag of a string. A method includes analyzing a plurality of continuous segments of a string deployed in a wellbore, and determining a deflection of the plurality of continuous segments from a node of the string and a tortuosity deflection of the wellbore. In response to a determination that deflection of the plurality of continuous segments from the node of the string is greater than the tortuosity deflection of the wellbore, the method includes applying a soft string model to determine a torque and a drag of the string. In response to a determination that deflection of the plurality of continuous segments from the node of the string is not greater than the tortuosity deflection of the (Continued)

wellbore, the method includes applying a stiff string model to determine a torque and a drag of the string.

20 Claims, 9 Drawing Sheets

(56) References Cited

U.S. PATENT DOCUMENTS

| | | | | |
|---|---|---|---|---|
| 5,431,046 | A * | 7/1995 | Ho | E21B 44/04 73/152.59 |
| 2004/0065437 | A1 * | 4/2004 | Bostick, III | G01V 1/52 166/250.01 |
| 2009/0157319 | A1 * | 6/2009 | Mitchell | E21B 47/022 702/9 |
| 2012/0123757 | A1 * | 5/2012 | Ertas | E21B 45/00 703/2 |
| 2016/0147918 | A1 * | 5/2016 | Samuel | E21B 43/14 703/2 |
| 2016/0281490 | A1 * | 9/2016 | Samuel | G05B 17/02 |
| 2016/0282491 | A1 * | 9/2016 | Samuel | E21B 7/12 |
| 2017/0159371 | A1 * | 6/2017 | Aniket | E21B 12/02 |
| 2017/0306748 | A1 * | 10/2017 | Marland | E21B 44/005 |
| 2018/0003031 | A1 | 1/2018 | Samuel | |
| 2018/0073347 | A1 | 3/2018 | Aniket et al. | |

FOREIGN PATENT DOCUMENTS

| | | |
|---|---|---|
| CN | 104564019 A | 4/2015 |
| EP | 1114240 A1 | 7/2001 |
| WO | 2013066746 A1 | 5/2013 |

OTHER PUBLICATIONS

Samuel et al. (Tortuosity Factors for Highly Tortuous Wells: A Practical Approach, SPE/IADC 92565, 2005) (Year: 2005).*
Samuel et al. (Tortuosity: The Rest of the Hidden Story, SPE/IADC-194167-MS, Mar. 2019) (Year: 2019).*
International Search Report and Written Opinion issued in Corresponding PCT International Patent Application No. PCT/US2020/014624, mailed on May 25, 2020.

* cited by examiner

SYSTEMS AND METHODS TO DETERMINE TORQUE AND DRAG OF A DOWNHOLE STRING

CROSS-REFERENCE TO RELATED APPLICATIONS

This International application claims priority to and benefit of U.S. Provisional Application No. 62/865,097, filed Jun. 21, 2019, the disclosure of which is incorporated by reference herein in its entirety.

BACKGROUND

Soft string and stiff string models are used by the oil and gas industry to determine torque and drag of a downhole string. The soft string model is calculated by treating the downhole string like a rope, without considering the hole size and radial clearance of a wellbore the downhole string is deployed in, whereas the stiff string model takes the effects of stiffness of the downhole string into consideration. Although, in theory, the stiff string model, which accounts for more parameters than the soft string model, would yield more accurate results, field tests show that the soft string model sometimes yields more accurate results than the stiff string model. As such, it is sometimes difficult to determine which model would yield better results without performing field tests on the results.

BRIEF DESCRIPTION OF THE DRAWINGS

Illustrative embodiments of the present disclosure are described in detail below with reference to the attached drawing figures, which are incorporated by reference herein, and wherein.

The illustrated figures are only exemplary and are not intended to assert or imply any limitation with regard to the environment, architecture, design, or process in which different embodiments may be implemented.

DETAILED DESCRIPTION

In the following detailed description of the illustrative embodiments, reference is made to the accompanying drawings that form a part hereof. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments is defined only by the appended claims.

Figure 1:
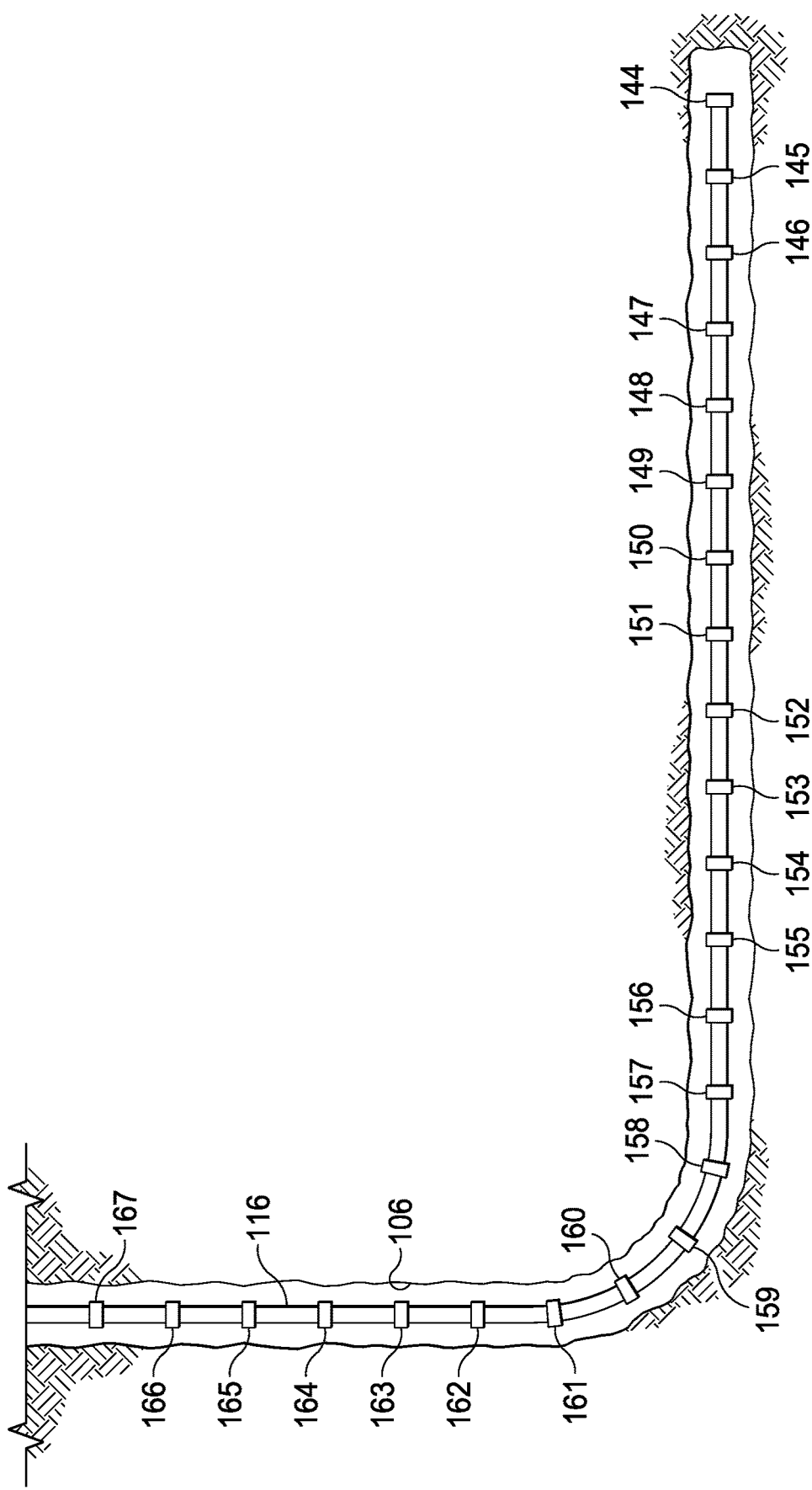
FIG. 1 is a cross-sectional view of a downhole string deployed in a wellbore.

The present disclosure relates to systems and methods to determine torque and drag of a downhole string. Examples of a downhole string includes a pipe, a drill pipe, a completion string, a downhole string, casing string, liner, or another type of conveyance that is deployed downhole. The torque and drag of a downhole string deployed downhole are sometimes calculated to determine drilling parameters, as well as specifications and material properties of downhole strings. In some embodiments, the amount of side force on a downhole string and the shape of the downhole string are determined and used to calculate the torque and drag force on the downhole string. Now turning to the figures, FIG. 1 illustrates a downhole string 116 that is deployed in a wellbore 106. Further, the downhole string 116 is divided into multiple continuous sections, each section having opposite ends at two adjacent nodes 144-167. In the embodiment of FIG. 1, each node 144-167 is also a survey point, at which measurements of properties of the downhole string are measured. Wellbore 106 includes a near vertical section (approximately perpendicular to the surface), a near horizontal section (approximately parallel to the surface), and a bent section connecting the near horizontal section and the near horizontal section. As referred to herein, a bent section of a wellbore refers to a section of the wellbore that has a dog-leg severity (DLS) greater than zero. In the embodiment of FIG. 1, sections of downhole string 116 between nodes 156 and 161 are deployed in the bent section. Soft string and stiff string models are two models sometimes used to determine the torque and drag of a downhole string such as downhole string 116 as the downhole string traverses a bent section of a wellbore. The soft string model assumes that the downhole string lays on the bottom of the wellbore as the downhole string travels downhole, whereas the stiff string model takes stiffness of the downhole string into account. As referred to herein, stiffness is a measurement of an object's resistance to bending. A system, such as the system illustrated in FIG. 8 determines whether to utilize the soft string model or the stiff string model to determine the torque and drag of downhole string 116 based on whether downhole string 116 exceeds an upper boundary of wellbore 106. Additional descriptions of the operations performed by the system to determine whether to utilize the soft string model or the stiff string model are provided in the paragraphs below.

Figure 2:
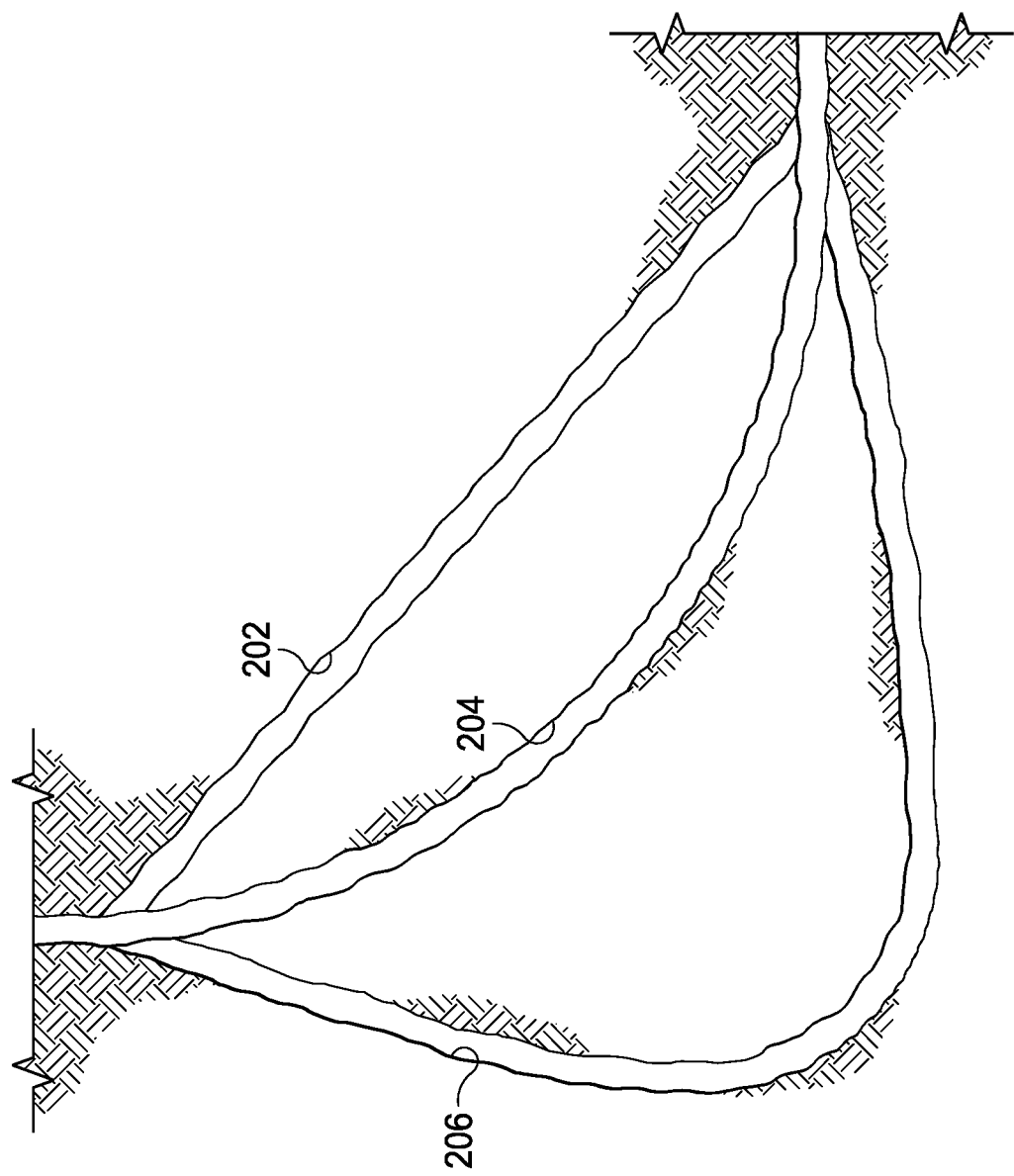
FIG. 2 is a conceptual illustration of three different shaped wellbores.

FIG. 2 is an illustration of three different shaped wellbores 202, 204, and 206. In the embodiment illustrated in FIG. 2, wellbore 202 is a straight wellbore with approximately zero DLS, wellbore 204 has a low DLS that is below a first threshold, whereas wellbore 206 has a high DLS that is above the first threshold. In some embodiments, the soft string model is utilized to calculate the torque and drag of a downhole string deployed in wellbore 202 regardless of the stiffness of the downhole string. More particularly, the soft string model is utilized if a stiff string deployed in wellbore 202 travels along the bottom of wellbore 202. In some embodiments, the stiff string model is utilized to calculate the torque and drag of a downhole string deployed in a high DLS wellbore, such as wellbore 206 even if the string has low stiffness. In that regard, the well path shape (e.g., the well path shape of wells 202, 204, and 206), is considered when determining whether to select the soft string model or the stiff string model.

As stated herein, in addition to stiffness and shape of the well path, the clearance of the wellbore also affects the shape of a downhole string as the downhole string traverses the wellbore. In a neutral state, the downhole string is inclined to keep its straight shape. In some embodiments, where the well path of a wellbore has a curve shape or has a tortuous shape, a downhole string traversing such well is assumed to have a sine-wave shape, which contacts the wellbore at peak points and valley points of the wellbore. The string is supported by the peak and valley points of the wellbore, and loads such as self-weight and buoyance force applied on the downhole string deflect the shape of the downhole string between two adjacent peak points and valley points. In some embodiments, when the shape of the downhole string theoretically exceeds boundaries formed by the wellbore wall, additional extra side force is exerted on the downhole string. In such embodiments, the stiff-string model is selected to model the downhole string. Alternatively, if the shape of the downhole string does not exceed the boundary formed by the wellbore's walls, the soft-string model is selected to model the downhole string.

In some embodiments, the stiff string model is more accurate due to its inclusion of the stiffness effects of the string, which changes the side force. However, in some embodiments, the soft string model matches the field data better than the stiff string model in most well sites.

In some embodiments, if a segment of downhole string is inserted into a curved wellbore with DLS, the section will bend by its selfweight, including the buoyance force effect, with the wellbore wall as the boundary of the deflection. In some embodiments, the top side of the wellbore section is considered as the top boundary and the bottom side of the wellbore section is considered as the bottom boundary. In some embodiments, the deflection in the middle of the downhole string segment is calculated by solving the following equation:

$$\Delta_w = C \frac{wL^4 \cos\alpha}{EI} \qquad \text{EQ. 1}$$

where w is the selfweight including the buoyance force, where E is young's modulus, L is the support distance, a is the angle of inclination, and I is an area moment of inertia.

Moreover, if the axial effect was ignored, and the local wellbore is an approximately straight segment, then the coefficient $$C \approx \frac{1}{384}$$

and w is calculated by solving the following equation:

$$w = (P_{pipe} - P_{mud}) g A \cos\alpha \qquad \text{EQ. 2}$$

where $P_{pipe}$ is the density of the pipe or string, $P_{mud}$ is density of the mud, g is the gravitational acceleration, and A is the cross-sectional area of a section of the downhole string.

In some embodiments, where the stiffness of the downhole string is infinite, the deflection of the downhole string is zero, or near zero, which indicates that the downhole string is a straight. In some embodiments, if the stiffness of the downhole string is zero, the deflection of the downhole string is infinite or near infinite, which indicates that the downhole string is a soft string that behaves like a rope, then the downhole string takes the same shape of wellbore or has a shape that is similar to the shape of the wellbore. However, the actual shape of a downhole string is often a shape between the straight line and a soft string.

Figure 3A:
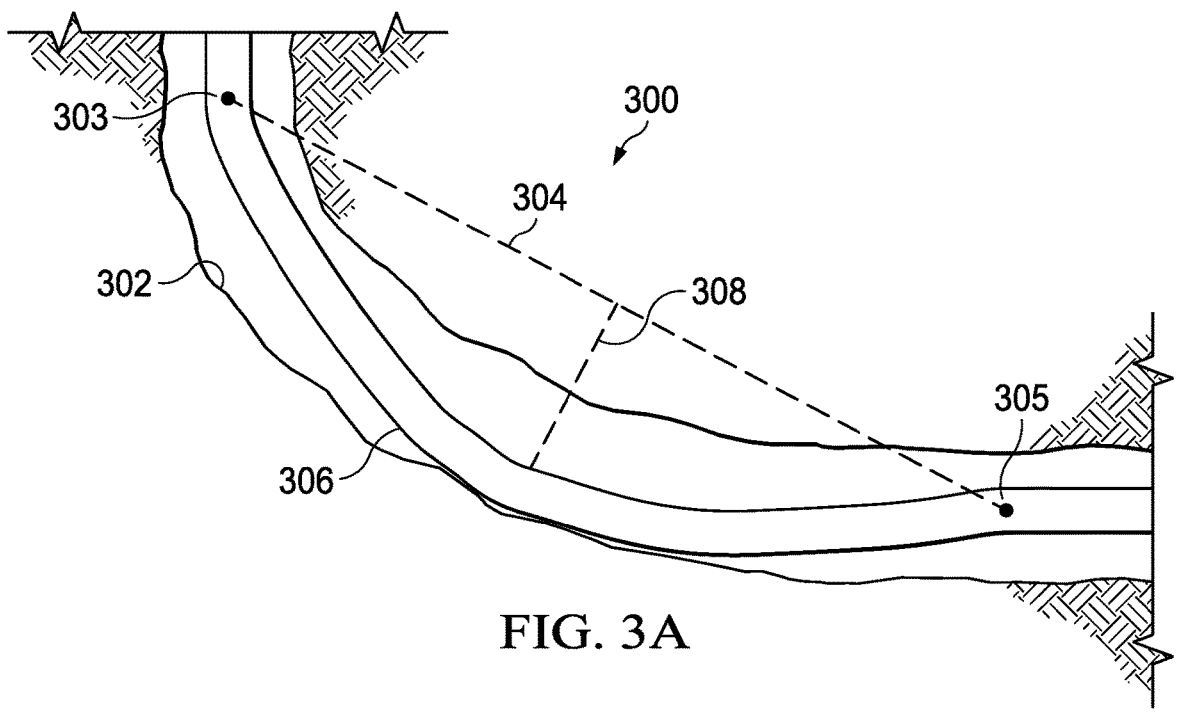
FIGS. 3A-3D are conceptual illustrations of a step-by-step process to determine whether to utilize the stiff string model or the soft string model based on the stiffness of the downhole string and the DLS of the wellbore.

FIGS. 3A-3D are conceptual illustrations of a step-by-step process to determine whether to utilize the stiff string model or the soft string model based on the stiffness of the downhole string and the DLS of the wellbore. FIG. 3A illustrates a downhole string deployed in a wellbore 300, where line 302 represents the lower boundary of wellbore 300 between locations 303 and 305, line 304 represents a theoretical shape of the downhole string between locations 303 and 305 if the downhole string does not experience any deflection (straight string), line 306 represents a theoretical shape of the downhole string between locations 303 and 305 due to self-weight and buoyance force without taking into account of the boundaries of wellbore 300 (deflected string), and line 308 represents the middle-point-deflection (M-P-D) of the downhole string.

As shown in FIG. 3A, deflected string 306 exceeds the bottom boundary 302 of wellbore 300, which would not occur since the shape of string is bound by the boundaries and dimensions of wellbore 300. As such, the downhole string is partitioned into two segments, and the analysis described above is performed on each segment.

Figure 3B:
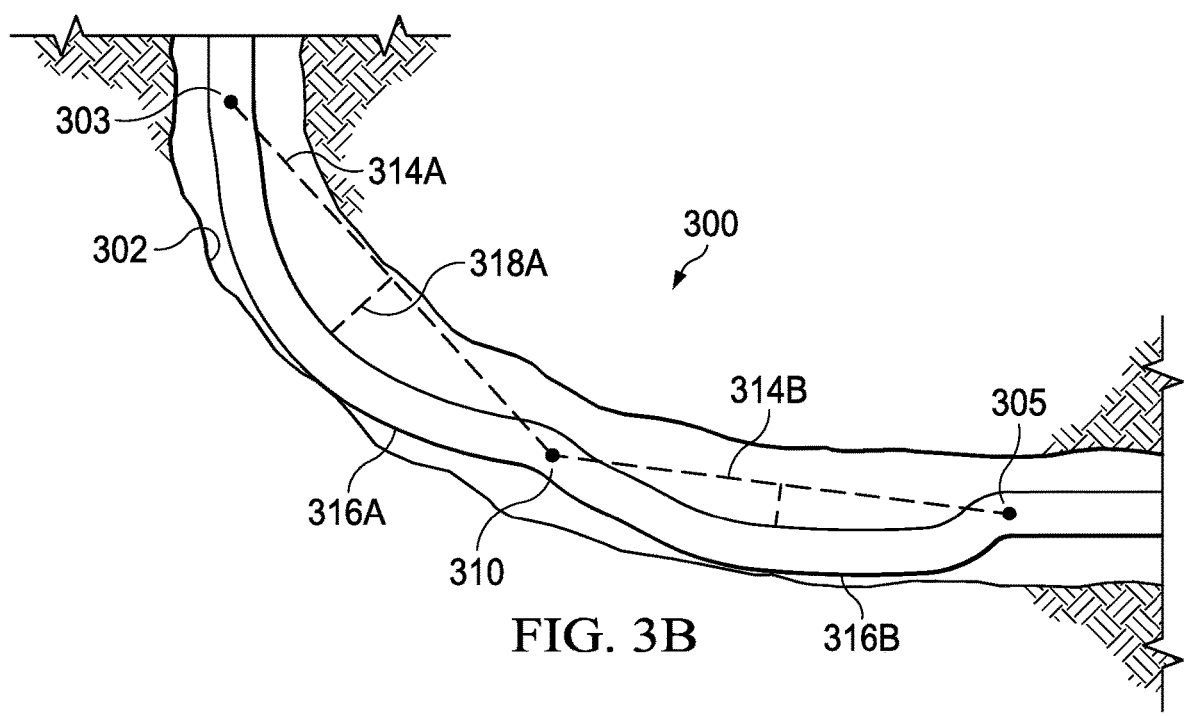

FIG. 3B illustrates the downhole string of FIG. 3A, after the downhole string is partitioned into a first section between locations 303 and 310, and a second partition between locations 310 and 305. Moreover, line 314A represents a first straight string segment between locations 303 and 310, line 314B represents a second straight string segment between locations 310 and 305, line 316A represents a first deflected string segment between locations 303 and 310, line 316B represents a second deflected string segment between locations 310 and 305, and line 318A represents the M-P-D of the first section of the downhole string between locations 303 and 310. As shown in FIG. 3B, first deflected string segment 316A also exceeds the bottom boundary 302 of wellbore 300, which would not occur since the shape of string is bound by the boundaries and dimensions of wellbore 300. As such, the downhole string is partitioned into smaller segments, and the analysis described above is performed on each segment, until the M-P-D of a deflected string segment fits within lower boundary 302 of wellbore 300.

Figure 3C:
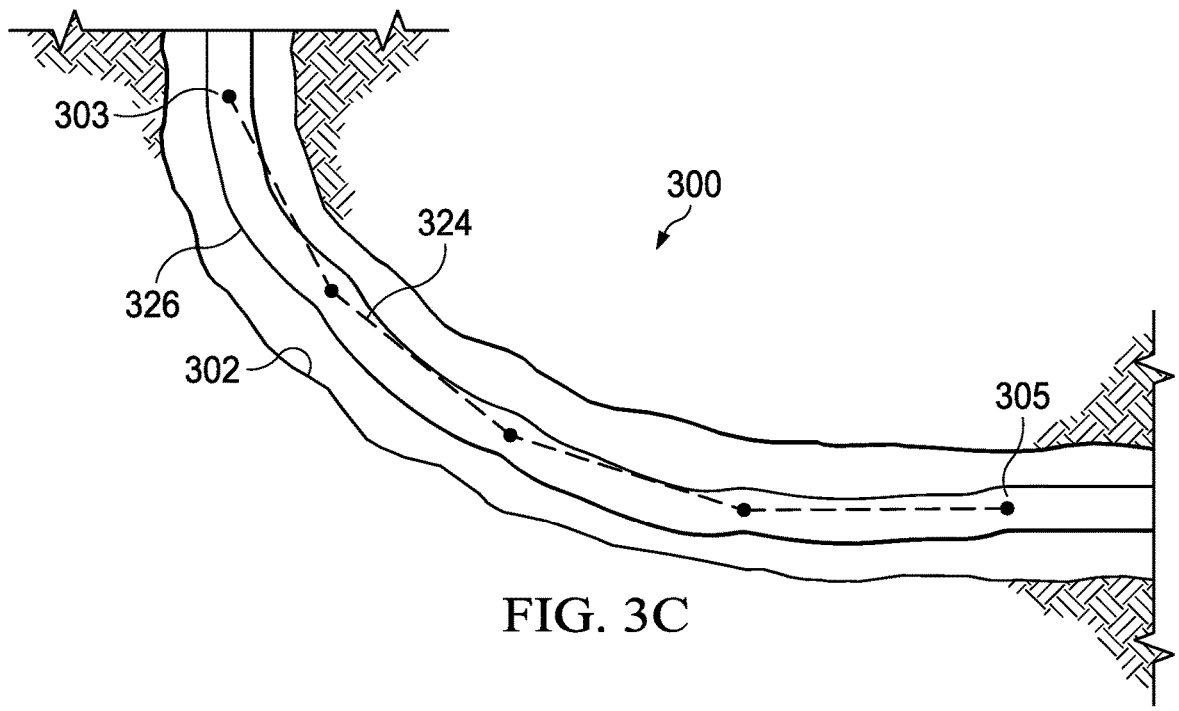

FIG. 3C illustrates the downhole string of FIG. 3B, after the downhole string is partitioned into a sufficient number of sections between locations 303 and 305, where the M-P-D at each segment of straight string 324 and deflection string 326 between locations 303 and 305 are within lower boundaries 302 of wellbore 300. After performing the operations described above and illustrated in FIG. 3C, an upper boundary of wellbore 300 is also taken into consideration.

Figure 3D:
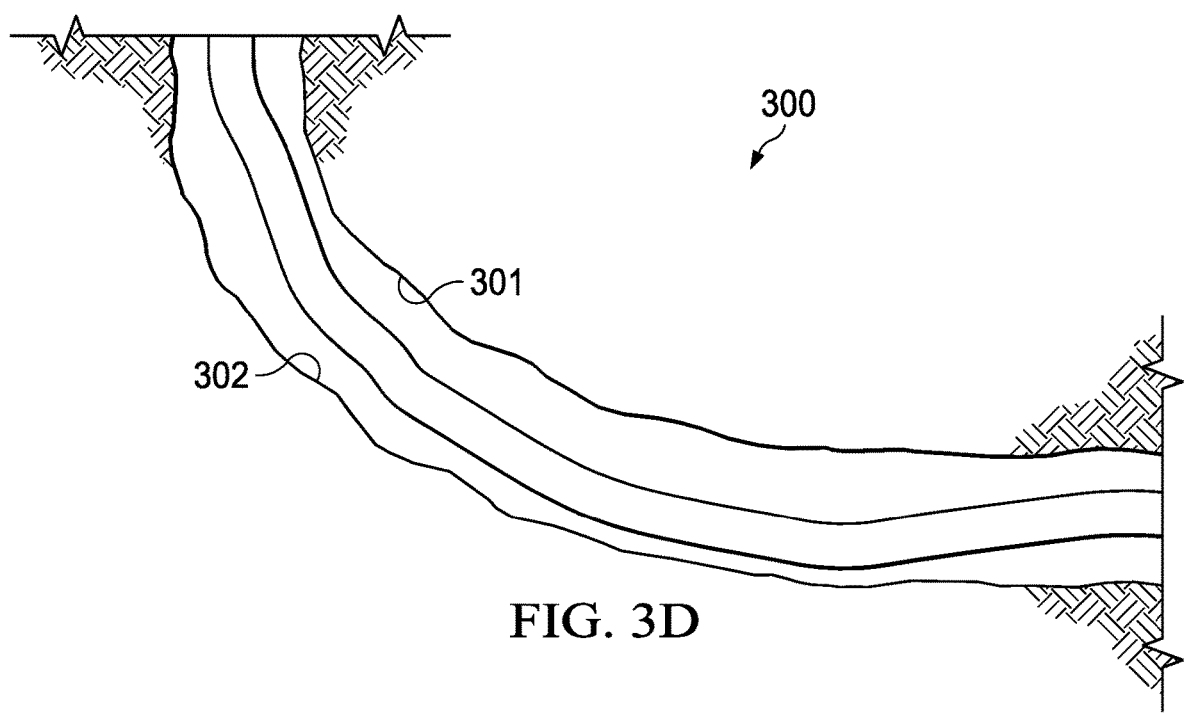

FIG. 3D illustrates the shape of downhole string of FIG. 3C deployed in wellbore 300, where lines 301 and 302 represent upper and lower boundaries of wellbore 300. In some embodiments, the soft string model is utilized to calculate torque and drag if the shape of the downhole string extends beyond upper boundaries 301 of wellbore 300. In some embodiments, the stiff string model is utilized to calculate torque and drag if the shape of the downhole string theoretically extends beyond upper boundaries 301 of wellbore 300.

In some embodiments, the distance from the bottom of a straight downhole string (e.g., line 304 of FIG. 3A) to the bottom boundary at the middle point of the downhole string is referred to as the bottom boundary space and is calculated from the following equation:

$$\delta_{dlsb} = R + \frac{D}{2} - \sqrt{\left(R + \frac{D}{2}\right)^2 - \left(\frac{L}{2}\right)^2} \qquad \text{EQ. 3}$$

where $\delta_{dlsb}$ represents the lower boundary space, which is the distance from the middle point of the bottom of a string segment to the bottom of the wellbore when the string is straight and supported by the bottom of the wellbore, where D is the diameter of the wellbore in inches, L is the length of the support distance, and R is the ratio of the wellbore path curve, and where R is calculated from the following equation:

$$R = \frac{C_0}{DLS} \qquad \text{EQ. 4}$$

where $C_0$ is a unit coefficient and DLS is the dog-leg-severity.

Further, the upper boundary space, which is the distance from the middle top point of the straight downhole string to the upper boundary is calculated based on the following equation:

$$\delta_{dlsu} = R - \frac{D}{2} - \sqrt{\left(R + \frac{D}{2}\right)^2 - \left(\frac{L}{2}\right)^2} + d \qquad \text{EQ. 5}$$

where $\delta_{dlsu}$ represents the upper boundary space, where D is the diameter of the wellbore in inches, L is the length of the support distance, and R is the ratio of the wellbore path curve.

In some embodiments, if the deflection in the middle of the segment due to its self-weight is more than the upper boundary space, then the top side of downhole string does not touch the upper boundary and no stiffness effect occurs to this downhole string. In such embodiments, the soft string model is used. Alternatively, the stiffness effect is considered and the stiff string model is used if Eq. 6 is correct.

$$\Delta_w > \delta_{dlsu} \qquad \text{EQ. 6}$$

Where $\Delta_w$ is the deflection of the downhole string by self-weight and buoyance load, and where $\delta_{dlsu}$ is the upper boundary space.

In some embodiments, the critical length of the string is calculated based on the following equation:

$$\frac{wL_{cru}^4 \cos\alpha}{384EI} = R - \frac{D}{2} - \sqrt{\left(R + \frac{D}{2}\right)^2 - \left(\frac{L_{cru}}{2}\right)^2} + d \qquad \text{EQ. 7}$$

where $L_{cru}$ represents the length of a critical distance of an upper wellbore boundary, a is the angle of inclination, EI is stiffness of the downhole string, D is the diameter of the wellbore in inches, L is the length of the support distance, and R is the ratio of the wellbore path curve. In some embodiments, when the support distance is equal to $L_{cru}$, the deflection of the string is equal to the lower boundary space. In some embodiments, the foregoing indicates that the middle point of the string just reach the bottom of wellbore.

Figure 4:
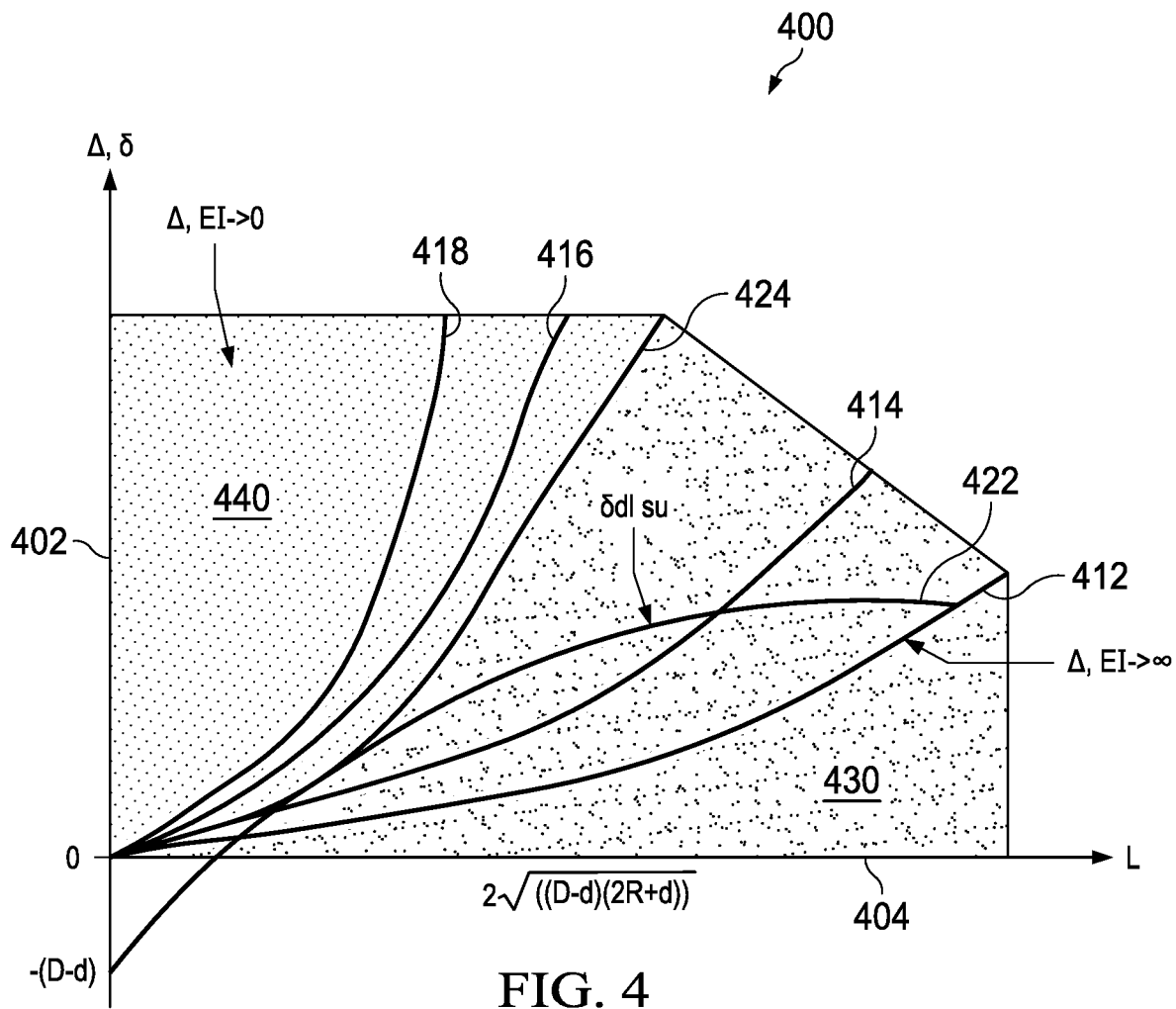
FIG. 4 is a graph that plots hypothetical deflection curves of a downhole string over the length of a section of the downhole string.

In some embodiments, there is no solution for equation 7. For example, if the stiffness of the downhole string (EI) is zero, then the value of left side of equation 7 will be larger than the value of right side. In such scenario, the zero stiffness string satisfies the rule in Eq. 6, which means the downhole string with zero stiffness lays on the bottom of the wellbore like a rope. However, the stiffness for an actual downhole string is not zero. Further, when the stiffness of the downhole string rises, the curve of the $\Delta_{dls}$ may cross the curve of an upper boundary space, such as the curve illustrated in FIG. 4. In that regard, FIG. 4 is a graph 400 that plots deflection curves of a downhole string over the length of a critical distance of an upper boundary of a wellbore. In the embodiment of FIG. 4, axis 402 represents deflection, axis 404 represents the length of a critical distance of an upper boundary of a wellbore. In the embodiment of FIG. 4, the deflection curve of the downhole string is defined by the stiffness of the downhole string. Line 424 represents a critical curve of the upper boundary of the wellbore that divides the first quadrant of graph into two regions 430 and 440. Line 418 represents the deflection curve of a downhole string having a stiffness that approaches 0, line 412 represents the deflection curve of a downhole string having a stiffness that approaches infinity, and lines 414 and 416 represent deflection curves of a downhole string having a stiffness than is between 0 and infinity. Further, line 422 represents the curvature of the upper boundary over the critical distance. As referred to herein the critical curve represents the curvature of a downhole string over a critical distance of a upper boundary of a wellbore that would bisect the upper boundary at only one point. Moreover, equation 8 below has one root at the critical curve $$\Delta_w = \delta_{dlsu} \qquad \text{EQ. 8}$$

where $\Delta_w$ is the deflection of the downhole string by self-weight and buoyance load, and where $\delta_{dlsu}$ is the upper boundary space. In the embodiment of FIG. 4, region 430 represents a region defined by the critical curve and the deflection curve of a downhole string having a stiffness that approaches infinity, whereas region 440 represents a region defined by the critical curve and the stiffness of a downhole string that approaches 0. In some embodiments, if the stiffness of the string is between 0 and the stiffness of a string having a deflection curve identical to the critical curve (e.g., in zone 440), then the string model is used, and if the stiffness of the string is between stiffness of a string having a deflection curve identical to the critical curve and infinity (in zone 430), then the stiff string model is used. In some embodiments, if the stiffness of the string is at the critical curve, then the soft string model is used. In some embodiments, if the stiffness of the string is at the critical curve, then the stiff string model is used.

In some embodiments, the zero stiffness downhole string does not reach the upper boundary of a wellbore. However, as the stiffness rises, it is possible for a downhole string to reach its upper boundary and for the stiffness effect to occur. The critical support distance for this is $L_{cru}$. Further, with respect to the bottom boundary, if $\Delta_w > \delta_{dlsb}$, the middle bottom point of the downhole string will drop to the bottom of the wellbore and be supported by the wellbore. In some embodiments, the middle bottom point of the downhole string is considered as a new support point, and the downhole string segment becomes two segments. The foregoing process is repeated to find the length of the downhole string, whose middle bottom point does not reach the wellbore bottom. When the length L decreases, the deflection $\Delta_w$ decreases much faster than the bottom boundary space $\delta_{dlsb}$ because the deflection $\Delta_w$ proportionate to $L^4$, where the bottom boundary space $\delta_{dlsb}$ is only proportionate to $L^1$. By repeating this calculation, the critical length $L_{crb}$ is determined, when the deflection at the middle bottom point of the segment $\Delta_{dis}$ equals the bottom boundary space $\delta_{dlsb}$. In such embodiments, the critical length is calculated by solving the following equation:

$$\frac{wL_{cru}^4 \cos\alpha}{384EI} = R + \frac{D}{2} - \sqrt{\left(R + \frac{D}{2}\right)^2 - \left(\frac{L_{crb}}{2}\right)^2} \qquad \text{EQ. 9}$$

where w is the self weight and buoyance load of the downhole string, $L_{cru}$ is the length of a critical distance of an upper wellbore boundary, a is the angle of inclination, EI is stiffness of the downhole string, D is the diameter of the wellbore in inches, L is the length of the support distance, and R is the ratio of the wellbore path curve.

In such embodiments, if the length of the downhole string segment is shorter than the bottom boundary critical length $L_{crb}$, the middle point of the segment does not reach the bottom boundary. To the contrary, if the length of the downhole string segment is longer than the bottom boundary critical length $L_{crb}$, the middle point of the downhole string will reach the bottom of the wellbore, which indicates that $L_{crb}$ is the longest possible support distance for one segment of the downhole string. In one or more of such embodiments, the shortest possible support distance is $L_{crb}/2$. The Eq. 9 is the status that the middle point of a downhole string just reaches the bottom of wellbore, which means there is one possible support point in the segment of $L_{crb}$. In some embodiments, two support points are found in the segment if the real support distance is less than $L_{crb}/2$. A comparison of the upper boundary critical length $L_{cru}$ and the bottom boundary critical length $L_{crb}$ is made. In one or more of such embodiments, the stiff string model is used if $L_{crb}/2 < L_{cru} < L_{crb}$, which indicates that the downhole string reaches the upper boundary. Alternatively, if the value of $\Delta_w$, which is of the downhole string by self-weight and buoyance, does not cross the $\delta_{dlsu}$ curve, which indicates that the downhole string does not reach the top boundary, and the soft string model is applied. Similarly, in some embodiments, where an average length of each segment of the downhole string $L_{avg}$ is equal to L/n where L is the length of the curved well path and n is the number of segments of the downhole string, n is increased until $L_{crb}/2 < L_{avg} < L_{crb}$, where $L_{crb}$ is the critical distance of bottom wellbore boundary. The deflection of the downhole string is calculated, the soft string model is used if the downhole string does not reach the upper boundary and $\Delta_w > \delta_{dlsu}$. Alternatively, the stiff string model is used if the downhole string does reach the upper boundary.

Figure 5:
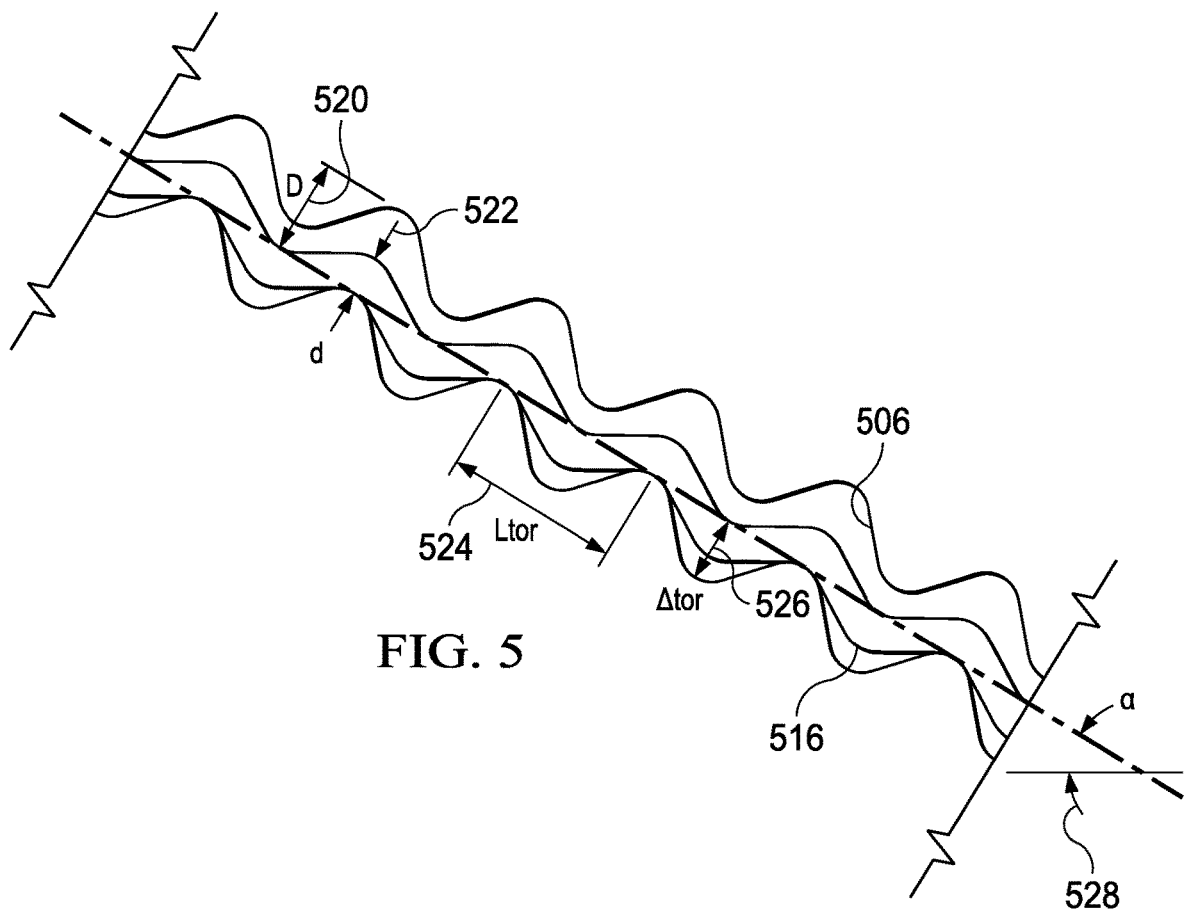
FIG. 5 is a cross-sectional view of a string deployed in a tortuous wellbore.

Most wellbores are not smooth but have a tortuous shape. In some embodiments, a downhole string deployed in a tortuous wellbore has a stiff effect. FIG. 5 illustrates a downhole string 516 deployed in a tortuous wellbore 506. More particularly, FIG. 5 shows the possible deflection for the downhole string 516 in the tortuous wellbore 506. In the embodiment of FIG. 5, line 520 represents the diameter of the wellbore 506, line 522 represents the outside diameter of the downhole string 516, line 524 represents the Support distance for a tortuous wellbore, line 526 represents deflection of the tortuous wellbore shape, and arc 528 represents the angle between the well path and a horizontal line. In some embodiments, a tolerable tortuosity value is determined. In some embodiments, if a hole is drilled with doglegs higher than the tolerable tortuosity value, additional side forces will be incurred. In some embodiments, if the hole is drilled with doglegs not higher the tolerable tortuosity value, then wellbore will not generate significant side force on the downhole string. In some embodiments, the tolerable tortuosity value depends on the depth in the well, and the downhole string/wellbore clearance.

As illustrated in FIG. 5, the tortuous shape of the wellbore 506 deflects the downhole string 516 and causes extra side force 516. The amount of the extra side force depends on the severity of the tortuosity, the clearance of the wellbore, and the stiffness of the downhole string. In some embodiments, if the tortuosity is greater than a threshold value, then the extra side force caused by tortuosity is large enough not to be negligible. In some embodiments, a finite element method is utilized to estimate the side force caused by tortuosity. In some embodiments, a finite element method to calculate the deflection of the plurality of continuous segments of the downhole string.

Figure 6:
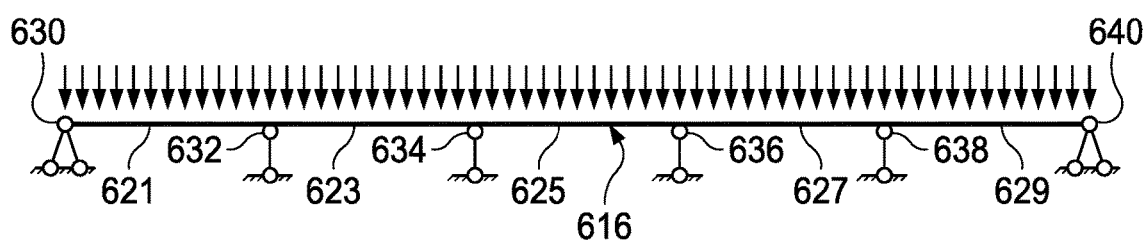
FIG. 6 is an illustration of a five-span continuous string model that analyzes a downhole string across five segments formed from six nodes.

More particularly, the downhole string in a tortuous wellbore naturally lays on the bottom of the inclined wellbore due to self-weight. The peak points of the tortuous wellbore on bottom provide side support to the downhole string. The downhole string is supported by many such peak points, making it a continuous string. A model that focuses on a few spans of downhole string in the local wellbore shape is utilized to analyze local elements of the downhole string. For example, a five-span continuous string mask model is used to analyze the force and deflection of the downhole string in the tortuous wellbore. In that regard, FIG. 6 illustrates a five-span continuous string model that analyzes a downhole string 616 across five segments 621, 623, 625, 627, and 629 formed from six nodes 630, 632, 634, 636, 638, and 640. More particularly, segment 621 has endpoints at nodes 630 and 632, segment 623 has endpoints at nodes 632 and 634, segment 625 has endpoints at nodes 634 and 636, segment 627 has endpoints at nodes 636 and 638, and segment 629 has endpoints at nodes 638 and 640. Further, down arrows represent load on downhole string 616. In some embodiments, the five-span continuous string model is used as a mask each time it is employed to calculate one tortuous wave and obtain its side force and deflection. In one or more of such embodiments, if the deflection of a span exceeds the wellbore bottom boundary, then the tortuosity in this span is ignored and the soft string model should be used for torque and drag analysis. If the deflection of a span exceeds the wellbore top boundary, then the tortuosity in this span causes the stiff effect and the stiff string model should be used for torque and drag analysis.

In some embodiments, the deflection of the central span (e.g., between nodes three and four of the model illustrated in FIG. 6) is calculated by the following equation:

$$\Delta_w = C\frac{wL_{tor}^4 \cos\alpha}{EI} \qquad \text{EQ. 10}$$

where C is a coefficient depending on the wellbore profile, $L_{tor}$ is the support distance of a tortuous wellbore, a is the inclination angle, and EI is the stiffness. In some embodiments, the tortuous wellbore is a wave shape with the same span distance, then $$C \approx \frac{1}{384}.$$

Similarly to the wellbore with DLS, a calculation of the deflection of the string to determine if the string reaches the upper boundary is made to choose between a stiff string model and a soft string model. In the tortuosity issue, the survey data give $L_{tor}$ and $\Delta_{tor}$. The upper boundary space is determined by the following equation:

$$\delta_{toru} = \Delta_{tor} - D + d \qquad \text{EQ. 11}$$

Where $\Delta_{tor}$ is the deflection of tortuous wellbore shape (tortuosity deflection), $\delta_{toru}$ is the upper boundary space for a tortuous wellbore, D is the dimeter of the wellbore, and d is the outer diameter of the downhole string.

In some embodiments, equation 11 is used to decide whether to use the stiff string or soft string model:

$$\Delta_w > \delta_{toru} \qquad \text{EQ. 12}$$

More particularly, if $\Delta_w > \delta_{toru}$, the deflection by self-weight is more than tortuosity deflection, therefore the soft string model should be applied. If $\Delta_w < \delta_{toru}$, the downhole string will reach the upper boundary and the stiff string model should be applied.

In some embodiments, the stiffness effect of a downhole string is predicted by calculating the local deflection of the downhole string and comparing it to the boundary of the wellbore. In one or more of such embodiments, a model with a few span continuous string is used to calculate the local deflection. In one or more embodiments, changes at farther locations do not influence the local deflection significantly. The above paragraphs describe five-span continuous string analysis model is proposed to calculate the downhole string deflection. In some embodiments, the five-span model is expanded to more spans to improve accuracy. In some embodiments, a finite elements model is applied to further improve the calculation including the axial force and bending angle effect. In some embodiments, wellbores are probably not only tortuous in shape but also include a DLS shape. In such embodiments, the two scenarios are merged by combining the wellbore shapes. The upper boundary is the key factor. If any point of the downhole string reaches the upper boundary of the wellbore, then the extra side force caused by the stiffness of the downhole string occurs and the stiff-string model should be applied.

In some embodiments, for a downhole string in a surveyed hole, stiff string results in lower torque and drag forces and thus lower hook load. In one or more embodiments, the foregoing is due to the tool joint and hole clearance being taken into account. In some embodiments, there will be a small difference in the hook load between soft and stiff string models. In some embodiments, the buckling prediction will be more accurate when using the stiff string model as it does not depend on the analytical solution used. In some embodiments, stiff string model provides more accurate estimation of sideforces of a component of interest.

In some embodiments, bending stress magnification is not used when using the stiff string model. In some embodiments, a stiff string model is used if a particular component of concern is due to stresses. In some embodiments, a stiff string model is used if string/hole clearance is of importance. In some embodiments, a stiff string model is used for accurate estimation of the casing wear. In some embodiments, a soft string model under predicts the side loads at a particular depth.

In some embodiments, parameters for using a stiff string model include one or more of 1) evaluate a downhole string containing stiff tubulars in a well with high doglegs e.g. 15°/100 ft; 2) analyze wellbores with long vertical sections; 3) observe buckling using the Position Plot; 4) components with a high degree of tubular stiffness are placed high up (near the rotary) in the downhole string; 5) analyze a downhole string with upsets typically found on stabilizers or friction reduction devices; and 6) analyze the position of the downhole string in the wellbore especially looking for high frequency position switching from one side to another.

Figure 7:
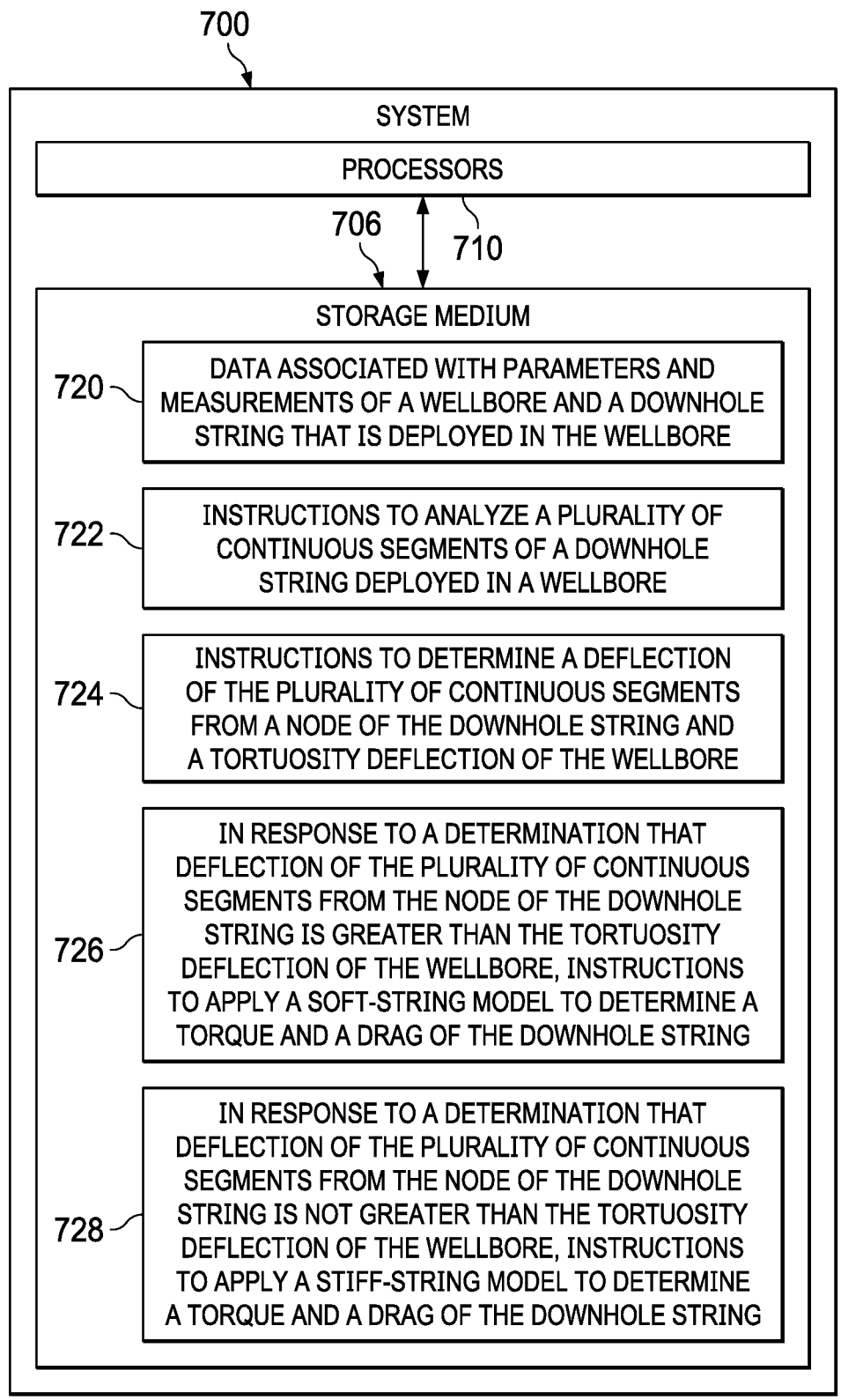
FIG. 7 is a block diagram of a system operable to determine torque and drag of a downhole string.

FIG. 7 is a block diagram of a system 700 that is operable of performing operations described herein to determine torque and drag of a downhole string and to determine whether to apply the soft string model or the stiff string model to determine the torque and drag of the downhole string. System 700 represents any electronic device operable to determine the torque and drag of a downhole string. Examples of system 700 include, but are not limited to, laptop computers, desktop computers, server systems, smartphones, tablet computers, as well as other types of electronic devices operable to perform operations described herein. System 700 includes a storage medium 706 and one or more processors 710. Storage medium 706 may be formed from data storage components such as, but not limited to, read-only memory (ROM), random access memory (RAM), flash memory, magnetic hard drives, solid state hard drives, CD-ROM drives, DVD drives, floppy disk drives, as well as other types of data storage components and devices. In some embodiments, storage medium 706 includes multiple data storage devices. In further embodiments, the multiple data storage devices may be physically stored at different locations. In some embodiments, storage medium 706 and processors 710 are stored remotely relative to each other.

Data associated with parameters and measurements of a wellbore and a downhole string that is deployed in the wellbore are stored at first location 720 of the storage medium 706. As shown in FIG. 7, instructions to analyze a plurality of continuous segments of a downhole string deployed in a wellbore are stored in a second location 722 of the storage medium 706. Further, instructions to determine a deflection of the plurality of continuous segments from a node of the downhole string and a tortuosity deflection of the wellbore are stored in a third location 724 of the storage medium 706. Further, instructions to apply a soft string model to determine a torque and a drag of the downhole string in response to a determination that deflection of the plurality of continuous segments from the node of the downhole string is greater than the tortuosity deflection of the wellbore are stored at a fourth location 726 of the storage medium 706. Further, instructions to apply a stiff string model to determine a torque and a drag of the downhole string in response to a determination that deflection of the plurality of continuous segments from the node of the downhole string is not greater than the tortuosity deflection of the wellbore are stored at a fifth location 728 of the storage medium 706.

Figure 8:
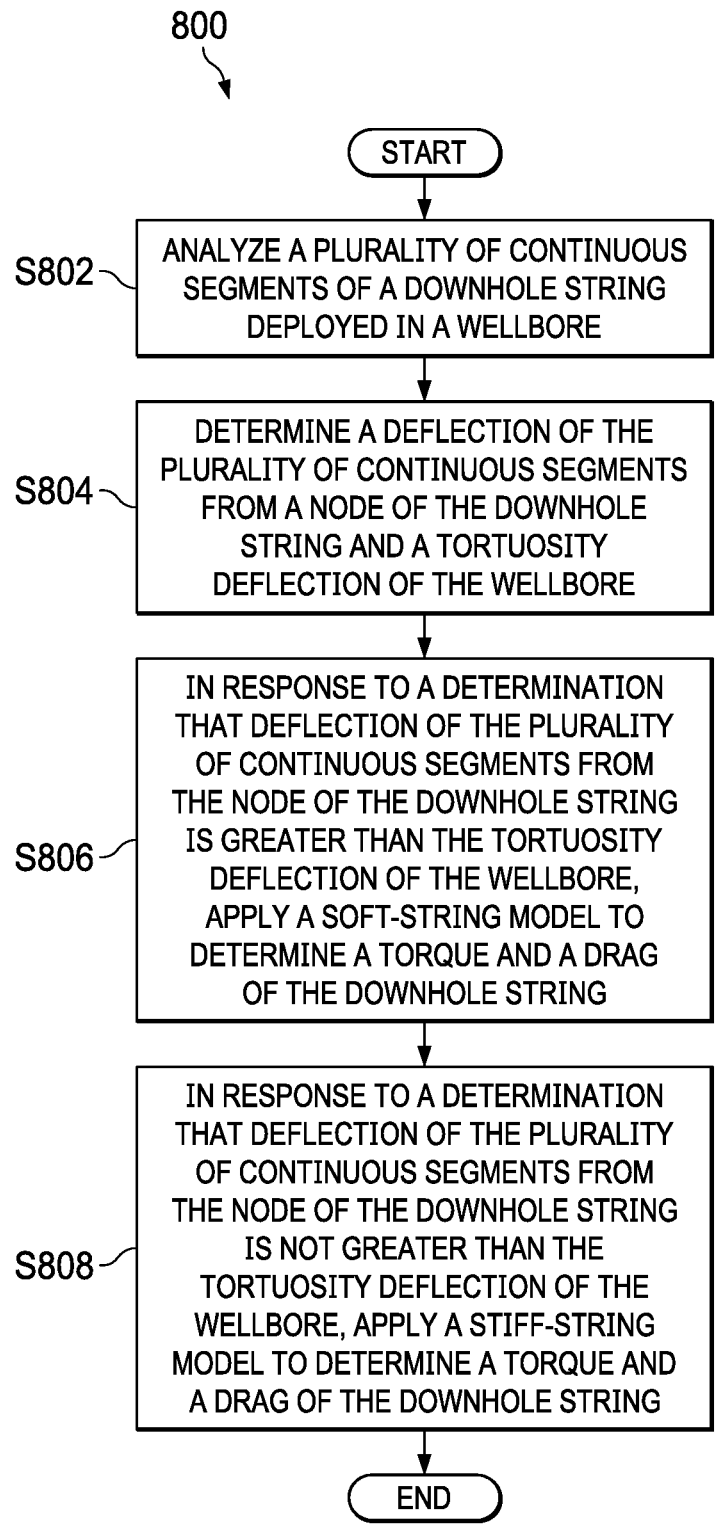
FIG. 8 is a flowchart of a process to determine torque and drag of a downhole string.

FIG. 8 is a flow chart of a process 800 to determine torque and drag of a downhole string, such as downhole strings 116 and 616 of FIGS. 1 and 6. Although the operations in the process 800 are shown in a particular sequence, certain operations may be performed in different sequences or at the same time where feasible. Further, although the following paragraphs describe operations performed by the system 700 of FIG. 7, the operations may be performed by other electronic devices operable to perform operations described herein to determine the torque and drag of the downhole string. At block S802, the system 700 analyze a plurality of continuous segments of a downhole string deployed in a wellbore. In some embodiments, the system 700 analyzes five adjacent segments of the downhole string to analyze the plurality of continuous segments. In some embodiments, the system 700 analyzes seven adjacent segments of the downhole string or a different number of adjacent segments of the downhole string to analyze the plurality of continuous segments. In some embodiments, the system analyzes the plurality of the continuous segments comprises ignoring end segments of the continuous segments. In some embodiments, the system analyzes the plurality of the continuous segments comprises ignoring the last two segments of the continuous segments on each end, or a different number of nodes on each end. At block S804, the system determines a deflection of the plurality of continuous segments from a node of the downhole string and a tortuosity deflection of the wellbore. In some embodiments, the system determines whether a deflection of the downhole string by weight and a buoyance load is outside an upper boundary space of the wellbore. The system, in response to a determination that deflection of the downhole string by self-weight and a buoyance load is outside the upper boundary of the wellbore, determines that the deflection of the continuous segments from the node of the downhole string is greater than the tortuosity deflection of the wellbore. Alternatively, the system, in response to a determination that the downhole string by self-weight and a buoyance load is not outside an upper boundary of the wellbore, determines that deflection of the plurality of continuous segments from the node of the downhole string is not greater than the tortuosity deflection of the wellbore. In some embodiments, the system also determines whether the deflection of the downhole string by an axial load of the downhole string is outside an upper boundary space of the wellbore. The system, in response to a determination that deflection of the downhole string by self-weight, a buoyance load and an axial load is outside an upper boundary space of the wellbore, determines that the deflection of the plurality of continuous segments from the node of the downhole string is greater than the tortuosity deflection of the wellbore. Alternatively, the system 700, in response to in a determination that deflection of the downhole string by self-weight, a buoyance load and an axial load is not outside an upper boundary space of the wellbore, determines that deflection of the plurality of continuous segments from the node of the downhole string is not greater than the tortuosity deflection of the wellbore At block S806, and in response to a determination that deflection of the plurality of continuous segments from the node of the downhole string is greater than the tortuosity deflection of the wellbore, the system 700 applies a soft string model to determine a torque and a drag of the downhole string. At block S808, and in response to a determination that deflection of the plurality of continuous segments from the node of the downhole string is not greater than the tortuosity deflection of the wellbore, the system 800 applies a stiff string model to determine a torque and a drag of the downhole string.

Figure 9:
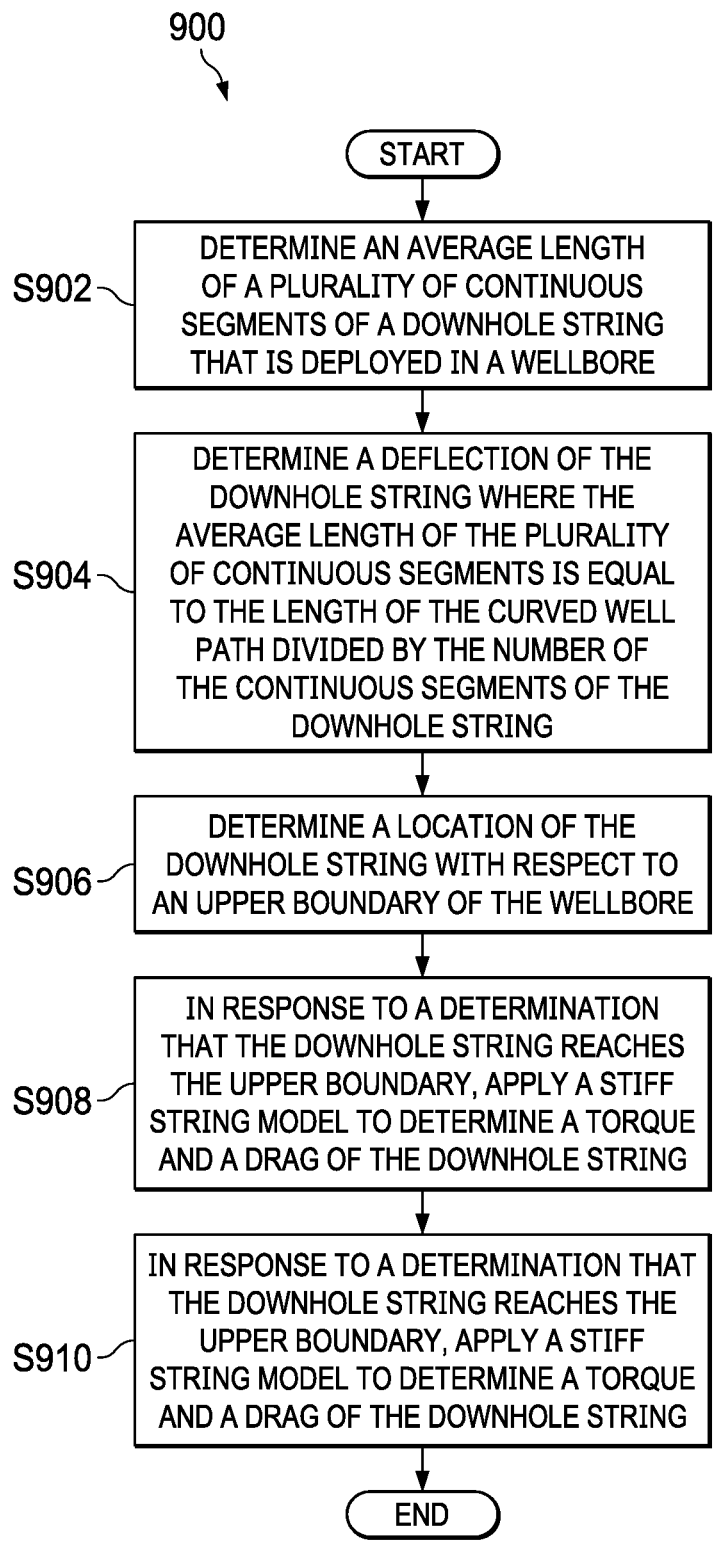
FIG. 9 is a flowchart of another process to determine torque and drag of the downhole string.

FIG. 9 is a flow chart of a process 900 to determine torque and drag of a downhole string, such as downhole strings 116 and 616 of FIGS. 1 and 6. Although the operations in the process 900 are shown in a particular sequence, certain operations may be performed in different sequences or at the same time where feasible. Further, although the following paragraphs describe operations performed by the system 700 of FIG. 7, the operations may be performed by other electronic devices operable to perform operations described herein to determine the torque and drag of the downhole string. At block S902, system 700 determines an average length of a plurality of continuous segments of a downhole string that is deployed in a wellbore, where the average length of the plurality of continuous segments of a downhole string is equal to a length of a curved well path divided by a number of the continuous segments of the downhole string. In some embodiments, system 700 first determines a minimum length of a segment of the plurality of segments of the downhole pipe that reaches a bottom boundary of the wellbore (critical length), where the average length of the plurality of continuous segments of the downhole string is less than the length of the critical length. In one or more of such embodiments, system 700 increases a value of the number of the continuous segments of the downhole string until the average length of the plurality of continuous segments of the downhole string is less than the critical length.

At block S904, system 700 determines a deflection of the downhole string where the average length of the plurality of continuous segments is equal to the length of the curved well path divided by the number of the continuous segments of the downhole string. At block S906, system 700 determines a location of the downhole string with respect to an upper boundary of the wellbore. At block S908, in response to a determination that the downhole string reaches the upper boundary, system 700 applies a stiff string model to determine a torque and a drag of the downhole string. At block S910, and in response to a determination that the downhole string reaches the upper boundary, system 700 applies a stiff string model to determine a torque and a drag of the downhole string.

Definitions of some of the variables used in the equations provided herein are provided below.

a=Inclination angle, (°)
P=Density of the material,
$\Delta_w$ Deflection of the downhole string by self-weight and buoyance load
$\Delta_{tor}$=Deflection of tortuous wellbore shape
$\delta_{toru}$=The upper boundary space for a tortuous wellbore
$\delta_{dlsb}$=The bottom boundary space for a smooth wellbore with dog-leg-severity
$\delta_{dlsu}$=The upper boundary space for a smooth wellbore with dog-leg-severity
A=Area of the downhole string section.
C=Coefficiency of the deflection equation.
D=Diameter of the wellbore, inches.
DLS=Dog-leg-severity
d=Outside diameter of the downhole string, inches.
E=Young's modulus
g=Acceleration resulting from gravity
L=Support distance
$L_{tor}$=Support distance for a tortuous wellbore
$L_{crb}$=Critical distance decided by bottom wellbore boundary
$L_{cru}$=Critical distance decided by upper wellbore boundary
W=Self weight and buoyance load
$L_{tor}$=Unit principal normal vector of wellbore trajectory
R=Radius of the well path with dog-leg-severity
Subscripts
i=Survey station index
n=Index The above-disclosed embodiments have been presented for purposes of illustration and to enable one of ordinary skill in the art to practice the disclosure, but the disclosure is not intended to be exhaustive or limited to the forms disclosed. Many insubstantial modifications and variations will be apparent to those of ordinary skill in the art without departing from the scope and spirit of the disclosure. For instance, although the flowcharts depict a serial process, some of the steps/processes may be performed in parallel or out of sequence, or combined into a single step/process. The scope of the claims is intended to broadly cover the disclosed embodiments and any such modification. Further, the following clauses represent additional embodiments of the disclosure and should be considered within the scope of the disclosure:

Clause 1, a method to determine torque and drag of a downhole string, the method comprising: analyzing a plurality of continuous segments of a downhole string deployed in a wellbore; determining a deflection of the plurality of continuous segments from a node of the downhole string and a tortuosity deflection of the wellbore; in response to a determination that deflection of the plurality of continuous segments from the node of the downhole string is greater than the tortuosity deflection of the wellbore, applying a soft string model to determine a torque and a drag of the downhole string; and in response to a determination that deflection of the plurality of continuous segments from the node of the downhole string is not greater than the tortuosity deflection of the wellbore, applying a stiff string model to determine a torque and a drag of the downhole string.

Clause 2, the method of clause 1, wherein analyzing the plurality of continuous segments comprises analyzing five adjacent segments of the downhole string.

Clause 3, the method of clause 1, wherein analyzing the plurality of continuous segments comprises analyzing seven adjacent segments of the downhole string.

Clause 4, the method of any of clauses 1-3, wherein the tortuosity deflection of the wellbore at a middle point of a middle segment of the plurality of continuous segments is equal to $$C \frac{wL_{tor}^4 \cos\alpha}{EI},$$

wherein C is a coefficient based on a profile of the wellbore, $L_{tor}$ is a unit principal normal vector of a wellbore trajectory, and EI is stiffness of the downhole string.

Clause 5, the method of clause 4, wherein the wellbore has a wave shape, and wherein C is approximately equal to $\frac{1}{384}$.

Clause 6, the method of any of clauses 1-5, further comprising: determining whether a deflection of the downhole string by self-weight and a buoyance load is greater than an upper boundary space of the wellbore; in response to a determination that deflection of the downhole string by self-weight and a buoyance load is greater than an upper boundary space of the wellbore, determining that the deflection of the plurality of continuous segments from the node of the downhole string is greater than the tortuosity deflection of the wellbore; and in response to a determination that deflection of the downhole string by self-weight and a buoyance load is not greater than an upper boundary space of the wellbore, determining that deflection of the plurality of continuous segments from the node of the downhole string is not greater than the tortuosity deflection of the wellbore.

Clause 7, method of any of clauses 1-6, wherein analyzing the plurality of the continuous segments comprises ignoring end segments of the continuous segments.

Clause 8, a system to determine torque and drag of a downhole string, the system comprising: a storage system; and one or more processors operable to: analyze a plurality of continuous segments of a downhole string deployed in a wellbore; determine a deflection of the plurality of continuous segments from a node of the downhole string and a tortuosity deflection of the wellbore; in response to a determination that deflection of the plurality of continuous segments from the node of the downhole string is greater than the tortuosity deflection of the wellbore, apply a soft string model to determine a torque and a drag of the downhole string; and in response to a determination that deflection of the plurality of continuous segments from the node of the downhole string is not greater than the tortuosity deflection of the wellbore, apply a stiff string model to determine a torque and a drag of the downhole string.

Clause 9, the system of clause 8, wherein the one or more processors analyze five adjacent segments of the downhole string to analyze the plurality of continuous segments.

Clause 10, the system of clause 8, wherein the one or more processors analyze seven adjacent segments of the downhole string to analyze the plurality of continuous segments.

Clause 11, the system of any of clauses 8-10, wherein the tortuosity deflection of the wellbore at a middle point of a middle segment of the plurality of continuous segments is equal to $$C \frac{wL_{tor}^4 \cos\alpha}{EI},$$

wherein C is a coefficient based on a profile of the wellbore, $L_{tor}$ is a equal to unit principal normal vector of a wellbore trajectory, and EI is stiffness of the downhole string.

Clause 12, the system of any of clauses 8-11, wherein the one or more processors are further operable to: determine whether a deflection of the downhole string by self-weight and a buoyance load is greater than an upper boundary space of the wellbore; in response to a determination that deflection of the downhole string by self-weight and a buoyance load is greater than an upper boundary space of the wellbore, determine that the deflection of the plurality of continuous segments from the node of the downhole string is greater than the tortuosity deflection of the wellbore; and in response to in a determination that deflection of the downhole string by self-weight and a buoyance load is not greater than an upper boundary space of the wellbore, determine that deflection of the plurality of continuous segments from the node of the downhole string is not greater than the tortuosity deflection of the wellbore Clause 13, the system of any of clauses 8-12, wherein the one or more processors ignore analyzing end segments of the continuous segments while analyzing the plurality of the continuous segments.

Clause 14, a machine-readable medium comprising instructions stored therein, which when executed by one or more processors, causes the one or more processors to perform operations comprising: analyze a plurality of continuous segments of a downhole string deployed in a wellbore; determine a deflection of the plurality of continuous segments from a node of the downhole string and a tortuosity deflection of the wellbore; in response to a determination that deflection of the plurality of continuous segments from the node of the downhole string is greater than the tortuosity deflection of the wellbore, apply a soft string model to determine a torque and a drag of the downhole string; and in response to a determination that deflection of the plurality of continuous segments from the node of the downhole string is not greater than the tortuosity deflection of the wellbore, apply a stiff string model to determine a torque and a drag of the downhole string.

Clause 15, the machine-readable medium of clause 14, wherein analyzing the plurality of continuous segments comprises analyzing five adjacent segments of the downhole string.

Clause 16, the machine-readable medium of clause 14, wherein analyzing the plurality of continuous segments comprises analyzing seven adjacent segments of the downhole string.

Clause 17, the machine-readable medium of any of clauses 14-16, wherein the tortuosity deflection of the wellbore at a middle point of a middle segment of the plurality of continuous segments is equal to $$C\frac{wL_{tor}^4 \cos\alpha}{EI},$$

wherein C is a coefficient based on a profile of the wellbore, $L_{tor}$ is a unit principal normal vector of a wellbore trajectory, and EI is stiffness of the downhole string.

Clause 18, the machine-readable medium of clause 17, wherein the wellbore has a wave shape, and wherein C is approximately equal to 1/384.

Clause 19, the machine-readable medium of any of clauses 14-17, further comprising instructions stored therein, which when executed by one or more processors, causes the one or more processors to perform operations comprising: determining whether a deflection of the downhole string by self-weight and a buoyance load is greater than an upper boundary space of the wellbore; in response to a determination that deflection of the downhole string by self-weight and a buoyance load is greater than an upper boundary space of the wellbore, determining that the deflection of the plurality of continuous segments from the node of the downhole string is greater than the tortuosity deflection of the wellbore; and in response to in a determination that deflection of the downhole string by self-weight and a buoyance load is not greater than an upper boundary space of the wellbore, determining that deflection of the plurality of continuous segments from the node of the downhole string is not greater than the tortuosity deflection of the wellbore.

Clause 20, the machine-readable medium of any of clauses 14-19, wherein analyzing the plurality of the continuous segments comprises ignoring end segments of the continuous segments.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, steps, operations, elements, and/or components, but do not preclude the presence or addition of one or more other features, steps, operations, elements, components, and/or groups thereof. In addition, the steps and components described in the above embodiments and figures are merely illustrative and do not imply that any particular step or component is a requirement of a claimed embodiment.

What is claimed is:

1. A computer-implemented method to determine torque and drag of a downhole string, the method comprising:
    deploying a downhole string in a wellbore;
    analyzing a plurality of continuous segments of the downhole string deployed in the wellbore;
    determining a deflection of the plurality of continuous segments from a node of the downhole string and a tortuosity deflection of the wellbore;
    in response to a determination that deflection of the plurality of continuous segments from the node of the downhole string is greater than the tortuosity deflection of the wellbore, applying a soft string model to determine a torque and a drag of the downhole string;
    in response to a determination that deflection of the plurality of continuous segments from the node of the downhole string is not greater than the tortuosity deflection of the wellbore, applying a stiff string model to determine a torque and a drag of the downhole string;
    using the determined torque and drag of the downhole string to determine one or more drilling parameters; and
    configuring the downhole string with the one or more drilling parameters for subsequent deployment of the downhole string in the wellbore.

2. The computer-implemented method of claim 1, wherein determining the deflection of the plurality of continuous segments comprises utilizing a finite element method to calculate the deflection of the plurality of continuous segments.

3. The computer-implemented method of claim 1, wherein the tortuosity deflection of the wellbore at a middle point of a middle segment of the plurality of continuous segments is equal to $$C\frac{wL_{tor}^4 \cos\alpha}{EI},$$

wherein C is a coefficient based on a profile of the wellbore, w is a self weight and buoyance load, $L_{tor}$ is a unit principal normal vector of a wellbore trajectory, $\alpha$ is an inclination angle, and EI is stiffness of the downhole string.

4. The method of claim 3, wherein the wellbore has a wave shape, and wherein C is approximately equal to 1/384.

5. The computer-implemented method of claim 1, further comprising:
    determining whether a deflection of the downhole string by self-weight and a buoyance load is outside an upper boundary space of the wellbore;
    in response to a determination that deflection of the downhole string by self-weight and a buoyance load is outside an upper boundary space of the wellbore, determining that the deflection of the plurality of continuous segments from the node of the downhole string is greater than the tortuosity deflection of the wellbore; and
    in response to in a determination that deflection of the downhole string by self-weight and a buoyance load is not outside an upper boundary space of the wellbore, determining that deflection of the plurality of continuous segments from the node of the downhole string is not greater than the tortuosity deflection of the wellbore.

6. The computer-implemented method of claim 5, further comprising:
determining whether the deflection of the downhole string by an axial load of the downhole string is outside an upper boundary space of the wellbore;
in response to a determination that deflection of the downhole string by self-weight, a buoyance load and an axial load is outside an upper boundary space of the wellbore, determining that the deflection of the plurality of continuous segments from the node of the downhole string is greater than the tortuosity deflection of the wellbore; and
in response to in a determination that deflection of the downhole string by self-weight, a buoyance load and an axial load is not outside an upper boundary space of the wellbore, determining that deflection of the plurality of continuous segments from the node of the downhole string is not greater than the tortuosity deflection of the wellbore.

7. The computer-implemented method of claim 1, further comprising:
determining a critical curve of the downhole string, wherein the critical curve of the downhole string bisects a curvature of the upper boundary space of the wellbore once over a distance of the upper boundary space;
determining a stiffness of the downhole string;
in response to a determination that the stiffness of the downhole string is between zero and a stiffness of a string having a deflection curve identical to the critical curve, applying the soft string model; and
in response to a determination that the stiffness of the downhole string is between a stiffness of a string having a deflection curve identical to the critical curve and infinity, applying the stiff string model.

8. The computer-implemented method of claim 1, wherein analyzing the plurality of the continuous segments comprises ignoring end segments of the continuous segments.

9. A computer-implemented method to determine torque and drag of a downhole string, the method comprising:
deploying a downhole string in a wellbore;
determining an average length of a plurality of continuous segments of the downhole string that is deployed in the wellbore, wherein the average length of the plurality of continuous segments of a downhole string is equal to a length of a curved well path divided by a number of the continuous segments of the downhole string;
determining a deflection of the downhole string where the average length of the plurality of continuous segments is equal to the length of the curved well path divided by the number of the continuous segments of the downhole string;
determining a location of the downhole string with respect to an upper boundary of the wellbore;
in response to a determination that the downhole string reaches the upper boundary, applying a stiff string model to determine a torque and a drag of the downhole string;
in response to a determination that the downhole string does not reach the upper boundary, applying a soft string model to determine a torque and a drag of the downhole string;
using the determined torque and drag of the downhole string to determine one or more drilling parameters; and
configuring a downhole string with the one or more drilling parameters for subsequent deployment of the downhole string in the wellbore.

10. The computer-implemented method of claim 9, further comprising determining a critical length, wherein the critical length is a minimum length of a segment of the plurality of segments of the downhole pipe that reaches a bottom boundary of the wellbore, wherein the average length of the plurality of continuous segments of the downhole string is less than the length of the critical length.

11. The computer-implemented method of claim 10, further comprising increasing a value of the number of the continuous segments of the downhole string until the average length of the plurality of continuous segments of the downhole string is less than the critical length.

12. A system to determine torque and drag of a downhole string, the system comprising:
a storage system; and
one or more processors operable to:
deploy a downhole string in a wellbore;
analyze a plurality of continuous segments of the downhole string deployed in the wellbore;
determine a deflection of the plurality of continuous segments from a node of the downhole string and a tortuosity deflection of the wellbore;
in response to a determination that deflection of the plurality of continuous segments from the node of the downhole string is greater than the tortuosity deflection of the wellbore, apply a soft string model to determine a torque and a drag of the downhole string;
in response to a determination that deflection of the plurality of continuous segments from the node of the downhole string is not greater than the tortuosity deflection of the wellbore, apply a stiff string model to determine a torque and a drag of the downhole string;
using the determined torque and drag of the downhole string to determine one or more drilling parameters; and
configuring a downhole string with the one or more drilling parameters for subsequent deployment of the downhole string in the wellbore.

13. The system of claim 12, wherein the one or more processors are further operable to utilize a finite element method to calculate the deflection of the plurality of continuous segments to determine the deflection of the plurality of continuous segments.

14. The system of claim 12, wherein the tortuosity deflection of the wellbore at a middle point of a middle segment of the plurality of continuous segments is equal to $$C\frac{wL_{tor}^4 \cos\alpha}{EI},$$

wherein C is a coefficient based on a profile of the wellbore, w is a self weight and buoyance load, $L_{tor}$ is a unit principal normal vector of a wellbore trajectory, $\alpha$ is an inclination angle, and EI is stiffness of the downhole string.

15. The system of claim 14, wherein the wellbore has a wave shape, and wherein C is approximately equal to $\frac{1}{384}$.

16. The system of claim 12, wherein the one or more processors are further operable to:

determine whether a deflection of the downhole string by self-weight and a buoyance load is outside an upper boundary space of the wellbore;

in response to a determination that deflection of the downhole string by self-weight and a buoyance load is outside an upper boundary space of the wellbore, determine that the deflection of the plurality of continuous segments from the node of the downhole string is greater than the tortuosity deflection of the wellbore; and in response to in a determination that deflection of the downhole string by self-weight and a buoyance load is not outside an upper boundary space of the wellbore, determine that deflection of the plurality of continuous segments from the node of the downhole string is not greater than the tortuosity deflection of the wellbore.

17. The system of claim 16, wherein the one or more processors are further operable to:

determine whether the deflection of the downhole string by an axial load of the downhole string is outside an upper boundary space of the wellbore;

in response to a determination that deflection of the downhole string by self-weight, a buoyance load and an axial load is outside an upper boundary space of the wellbore, determine that the deflection of the plurality of continuous segments from the node of the downhole string is greater than the tortuosity deflection of the wellbore; and in response to in a determination that deflection of the downhole string by self-weight, a buoyance load and an axial load is not outside an upper boundary space of the wellbore, determine that deflection of the plurality of continuous segments from the node of the downhole string is not greater than the tortuosity deflection of the wellbore.

18. The system of claim 12, wherein the one or more processors ignore analyzing end segments of the continuous segments while analyzing the plurality of the continuous segments.

19. The system of claim 12, wherein the one or more processors analyze five adjacent segments of the downhole string to analyze the plurality of continuous segments.

20. The system of claim 12, wherein the one or more processors analyze seven adjacent segments of the downhole string to analyze the plurality of continuous segments.

* * * * *